US 8,581,566 B2

(12) United States Patent
Takahashi et al.

(10) Patent No.: US 8,581,566 B2
(45) Date of Patent: Nov. 12, 2013

(54) POWER SUPPLY CONTROLLER HAVING ANALOG TO DIGITAL CONVERTER

(75) Inventors: Hideyuki Takahashi, Kanagawa (JP); Yoshimi Matsumoto, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/609,093

(22) Filed: Sep. 10, 2012

(65) Prior Publication Data

US 2013/0002222 A1 Jan. 3, 2013

Related U.S. Application Data

(62) Division of application No. 12/461,655, filed on Aug. 19, 2009, now Pat. No. 8,310,220.

(30) Foreign Application Priority Data

Aug. 29, 2008 (JP) ................................ 2008-221496

(51) Int. Cl.
*G05F 1/40* (2006.01)

(52) U.S. Cl.
USPC .......................................... 323/283; 323/284

(58) Field of Classification Search
USPC .................. 323/268, 271, 282–285, 349, 351
See application file for complete search history.

(56) References Cited

U.S. PATENT DOCUMENTS

| 6,917,185 | B2 * | 7/2005 | Okamoto ...................... 323/241 |
|---|---|---|---|
| 6,933,709 | B2 | 8/2005 | Chapuis |
| 7,038,438 | B2 | 5/2006 | Dwarakanath et al. |
| 7,355,371 | B2 * | 4/2008 | Chao et al. .................... 323/267 |
| 8,080,986 | B2 * | 12/2011 | Lai et al. ....................... 323/285 |
| 8,130,522 | B2 * | 3/2012 | Maksimovic .................. 363/89 |
| 8,148,965 | B2 | 4/2012 | Takahashi |
| 8,264,212 | B2 * | 9/2012 | Takahashi ..................... 323/283 |
| 2010/0134083 | A1 * | 6/2010 | Trescases ...................... 323/283 |
| 2012/0043953 | A1 * | 2/2012 | Ohmaru ........................ 323/283 |

FOREIGN PATENT DOCUMENTS

JP 2006-140819 A 6/2006

OTHER PUBLICATIONS

U.S. Office Action dated May 1, 2012, in U.S. Appl. No. 12/461,655.

* cited by examiner

*Primary Examiner* — Matthew Nguyen
(74) *Attorney, Agent, or Firm* — McGinn IP Law Group, PLLC

(57) ABSTRACT

A power supply control method of performing a feedback control of an output voltage based on a deviation signal for a standard voltage value serving as a target value for the output voltage and a digital signal generated by analog/digital (A/D) conversion of the output voltage, the method includes selecting a range of the reference voltage for the A/D conversion based on the digital signal in a power supply startup period, and selecting a range of the reference voltage for the A/D conversion based on the deviation signal or a signal corresponding to the deviation signal in a steady state period.

8 Claims, 9 Drawing Sheets

POWER SUPPLY CONTROLLER HAVING ANALOG TO DIGITAL CONVERTER

The present application is a Divisional Application of U.S. patent application Ser. No. 12/461,655, filed on Aug. 19, 2009, now U.S. Pat. No. 8,310,220 which is based on Japanese patent application No 2008-221496, filed on Aug. 29, 2008, the entire contents of which is incorporated herein by reference.

BACKGROUND OF THE INVENTION

1. Field of the Invention

The present invention relates to a digitally-controlled power supply controller and power supply control method, and relates in particular to control technology for an A/D (analog/digital) converter for digitally controlled power supplies.

2. Description of Related Art

In recent years, digitally controlled power supply controllers are being utilized to extend the operating time of mobile devices such as cellular telephones that have become widely used. In digitally controlled power supply controllers, an A/D converter carries out sampling to sample the output voltage. Sampling with a high-resolution A/D converter must be performed in order to suppress fluctuations in the output voltage. In digitally controlled power supply controllers have problems with high-speed startups and regulating the startup speed of the supply voltage when switching between applications using different voltages.

FIG. 7 is a block diagram of the A/D converter of a related art described in Japanese Patent Application Laid Open No. 2006-140819.

An A/D converter 1 contains a sample hold circuit 3, a D/A converter 4, a comparator 5, and a successive comparator control circuit 10. The successive comparator control circuit 10 includes a maximum setting value register 11, a minimum value setting register 12, a successive comparator register 15, and a CPU (not shown in drawing) for performing A/D conversion processing. The maximum value register 11 and a minimum value setting register 12 are connected to a data bus 6 and an address bus 7.

FIG. 8 and FIG. 9 illustrates the A/D conversion processing implemented by the CPU in the successive comparator control circuit 10. The CPU sets the maximum value (Vmax register value) stored in maximum value setting register 11 as a temporary maximum value Vmax for the reference voltage (S201). The CPU sets a minimum value (Vmin register value) stored in the minimum value setting register 12, as a temporary minimum value Vmin for the reference voltage (S202). The CPU next processes these temporarily set maximum value Vmax and minimum value Vmin, adjusting them for use as reference voltage that can be output by the DAC4 (S203-S208). The CPU first of all decides whether or not the minimum value Vmin temporarily set in S202 and subtracted from the temporary maximum value Vmax set in S201, can be expressed as a power-of-two. The CPU in other words, decides whether the minimum value Vmin is divisible by two (S203 in FIG. 9). If the CPU decides the value is divisible by two (S203: Y), then the processing proceeds to S209 (FIG. 8). If the CPU decides the value is not divisible by two (S203: N) then a minimum increase/decrease width Vlsb determined by the conversion accuracy is added to the maximum value Vmax, and this summed value is then set as the maximum value Vmax (S204).

When the maximum value for a settable reference voltage is 5 V at a conversion accuracy of four bits, then the minimum increase/decrease width Vlsb at which the reference voltage can be increased or decreased is 0.625 V (=5 V/8). The CPU next decides whether the maximum values Vmax required via S204 have all become a "1" or not. The CPU in other words decides whether the upper limit of the settable maximum Vmax value has been reached (S205). If decided that the upper limit has not been reached (S205: N), then the processing returns to step S203, and a decision made on whether the value found from subtracting the minimum value Vmin from the maximum value Vmax found in S204 is divisible by two or not. If that value cannot be divided by two (S203: N), then the minimum increase/decrease width Vlsb is again added to the maximum value Vmax (S204). The maximum value Vmax is in other words repeatedly increased within a range that does not exceed the upper limit, and when the value found from subtracting the minimum value Vmin from the maximum value Vmax reaches a figure divisible by two (S203: Y), then the processing proceeds to S209.

If the CPU decides that the upper limit of the maximum value Vmax was reached (S205: Y), then a value found from subtracting the minimum increase/decrease width Vlsb from the minimum value Vmin temporarily set earlier in S202 (FIG. 8) is set as a new minimum value Vmin (S206). The CPU next decides whether the minimum values Vmin found in S206 are all zeroes or not in other words decides whether the lower limit for the settable minimum value Vmin was reached or not (S207). If decided that the lower limit was not reached (S207: N), then the CPU decides whether the maximum value Vmax, or in other words whether the value found from subtracting the minimum value Vmin found in S206 from the upper limit is divisible by two or not (S208). Here, if decided that value is not divisible by two (S208: N), then the minimum increase/decrease width Vlsb is once again subtracted from the minimum value Vmin (S206). In other words, if in a range not reaching the lower limit then the minimum value Vmin is repeatedly decreased, and when the value found from subtracting the minimum value Vmin from the maximum value Vmax reaches a value divisible by two (S208: Y), then the processing proceeds to S209.

In other words, the range of reference voltages outputted from DAC4 is set automatically based on the maximum value (Vmax register value) and minimum value (Vmin register value) input by the user.

The CPU next calculates the value obtained from summing the maximum value Vmax and the minimum value Vmin found in S203-S208 by two, or in other words, calculates the center value Vmid of the maximum value Vmax and the minimum value Vmin (S209). Next, (5 V+0 V)/2=2.5 V is calculated for the case where the maximum value Vmax for example is 5 V, and the minimum value Vmin is 0 V. The successive comparator control circuit 10 at this time outputs a digital output code for outputting reference voltages corresponding to the center value Vmid to the DAC4 as a control signal. The DAC4 in this way performs digital/analog (DA) conversion of the DAC control signal that was input, and outputs to the comparator 5 these reference voltages corresponding to center value Vmid.

The comparator 5 then compares the reference voltage (Vmid) outputted from the DAC4, with the analog input voltage Vin held by the S/H circuit 3, and outputs a signal corresponding to those comparison results to the successive comparator circuit 10. The CPU then decides whether the signal outputted from the comparator 5 shows comparison results such that the analog input voltage is larger. Vin is larger than the reference voltage (Vmid) or not (S210). If the comparison results show the analog input voltage Vin is larger than the reference voltage (Vmid) (S210: Y), then the reference voltage (Vmid) is set to a new minimum value Vmin (S211). If for example, the analog input voltage Vin is 3 V, and the reference voltage (Vmid) is 2.5 V, then the CPU decides that the analog input voltage Vin is larger than the reference voltage (Vmid) (S210:Y), and the 2.5 V of the reference voltage (Vmid) is set to a new minimum value Vmin (S211).

If the CPU decides that the comparison results show that the analog input voltage Vin is smaller than the reference voltage (Vmid) (S210:N), then the reference voltage (Vmid) is set to a new maximum value Vmax (S212). If for example, the analog input voltage Vin is 2 V, and the reference voltage (Vmid) is 2.5 V, then the CPU decides that the analog input voltage Vin is smaller than the reference voltage (Vmid) (S210:N), and the 2.5 V of the reference voltage (Vmid) is set to a new minimum value Vmin (S212).

The CPU next decides if the value found from subtracting the minimum value Vmin from the maximum value Vmax has become the minimum increase/decrease width Vlsb or not. In other words, the CPU decides whether the center value Vmid for the maximum value Vmax and minimum value Vmin is in a state that cannot be calculated (S213). For example, if the conversion accuracy (resolution) is 4 bits, maximum value Vmax is 5 V, the minimum value Vmin is 0 V, then the 0.625 V (=5 V/8) becomes the minimum increase/decrease width Vlsb so that the CPU decides if the value found from subtracting minimum value Vmin from the maximum value Vmax is 0.625 V or not (S213).

If the CPU here decides that the center value Vmid cannot be calculated in this state (S213:N), then the process returns to S209 and center value Vmid is again calculated and a comparison made with that center value Vmid (S210). If for example, the analog input voltage Vin is 3 V, and the minimum value Vmin newly set previously in S211 is 2.5 V, then the CPU calculates that the center value Vmid=(5 V+2.5 V)/2=3.75 V (S209), and compares the analog input voltage of 3 V with the center value of 3.75 V (S210). The CPU therefore compares the analog input voltage Vin with the reference voltage (Vmid) as described above (S210), and based on those comparison results decides a new minimum value Vmin or maximum value Vmax (S211, S212) and calculates a new center value Vmid based on the minimum value Vmin or maximum value Vmax that were decided (S209). The CPU repeats this processing that compares the analog input voltage Vin with the reference voltage (Vmid) that is the new center value Vmid (S210).

Then, when the CPU decides the center value Vmid is in a state that cannot be calculated (S213:Y), it stores, a conversion value VSAR needed for finding the maximum value Vmax used in the final comparison in S213 in SAR15 (S214).

The range of the reference voltage (Vmid) required for making the comparison is set in this way based on the maximum value Vmax and minimum value Vmin set by the user, and set so as not to make comparisons with reference voltages (Vmid) outside this range.

SUMMARY

The related Art has a problem that normal A/D conversion of output voltages in digitally-controlled power supplies was impossible if the output voltages are outside the reference voltage range during A/D conversion.

A power supply controller includes an analog to digital (A/D) converter that performs analog-digital conversion of an output voltage and outputs a digital signal, a deviation signal generator unit that generates a deviation signal from the digital signal and a standard voltage value serving as an output voltage target value, and a power controller unit that controls the output voltage based on the deviation signal. The power supply controller includes a conversion range setting unit that sets a range of the reference voltage into the A/D converter based on a first signal as the digital signal in a power supply startup period, and sets the reference voltage range into the A/D converter based on a second signal as the deviation signal or as a signal corresponding to the deviation signal in a steady state period.

The power supply control method of the present invention is a feedback control method that regulates the output voltage based on a deviation signal for a standard voltage value serving as the target output voltage value, and a digital signal generated by A/D conversion of the output voltage; and in which the reference voltage range for A/D conversion is selected during the power supply start up period based on the digital signal and, the reference voltage range for A/D conversion is selected in the steady state period based on a signal using the deviation signal or on the deviation signal. This type of method allows quick power supply voltage startups.

The present invention provides a power supply controller and a power supply control method that achieves quick power supply startups.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
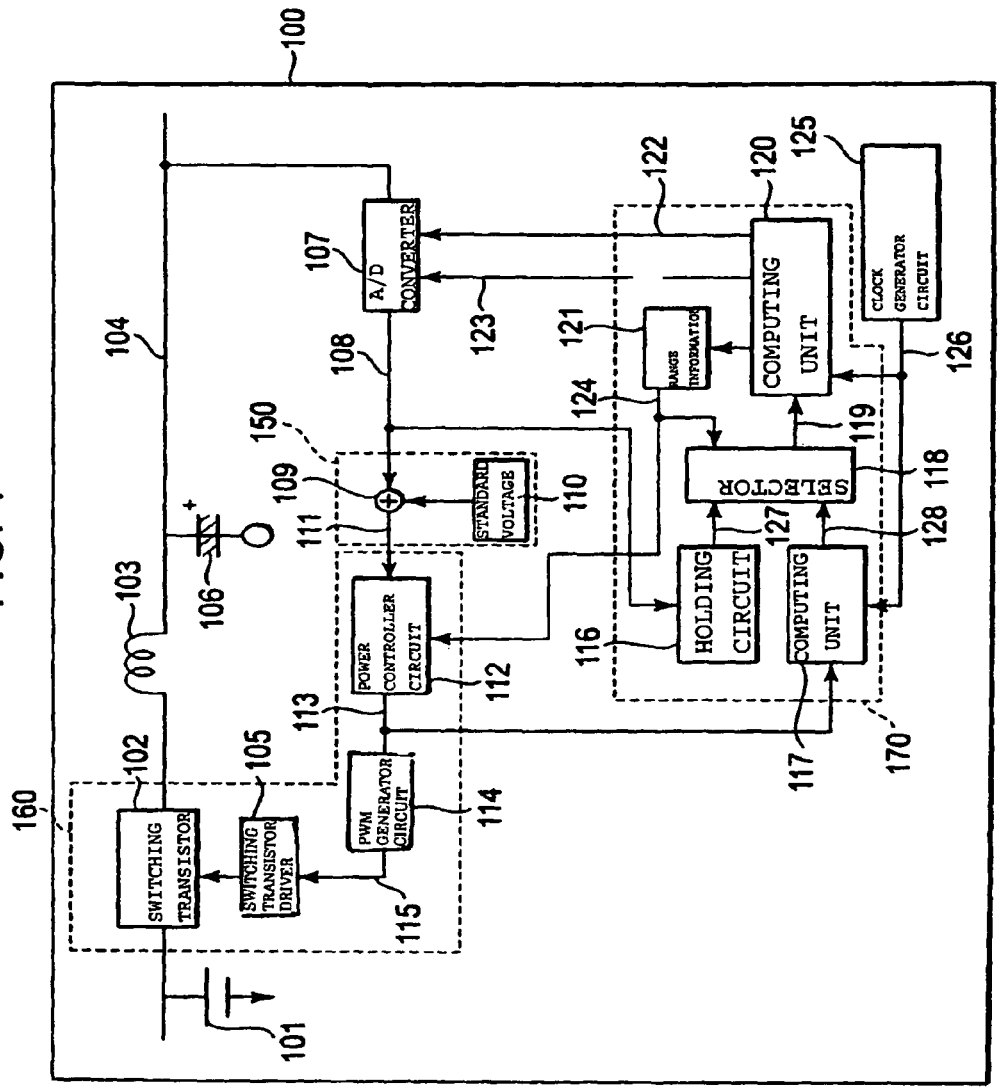
FIG. 1 is a block diagram of the power supply controller of a first exemplary embodiment of the present invention.

FIG. 1 is a block diagram of the power supply controller of a first exemplary embodiment. A power supply controller 100 includes: an input power supply 101, an inductor 103, a capacitor 106, and A/D converter 107, a clock generator circuit 125, a deviation signal generator unit 150, a power supply controller unit 160 and conversion range setting unit 170. The deviation signal generator unit 150 includes a computing circuit 109 and a standard voltage 110, and generates a deviation signal from the standard voltage 110 and the A/D converter output 108 outputted from the A/D converter 107. The power controller unit 160 contains a switching transistor 102, a switching transistor driver 105, a power controller circuit 112, and a PWM generator circuit 114, and regulates the output voltage 104 based on the deviation signal generated by the deviation signal generator unit 150. The conversion range setting unit 170 contains a holding circuit 116, a computing unit 117, a selector 118, a computing unit 120 as well as the range information 121.

The output signal from the switching transistor driver 105 serving as a switching circuit and input voltage 101 is inputted to the switching transistor 102. The output signal from the switching transistor 102 is inputted to the inductor 103. The output signal from the inductor 103 is inputted to the capacitor 106 and the A/D converter 107. The inductor 103 and the capacitor 106 here smooth the output signal from the switching transistor 102, and the voltage after smoothing is set as the output voltage 104.

The A/D converter 107 inputs or receives the maximum voltage value 122 and minimum voltage value 123 that were input from the output voltage 104 and computing unit 120, and outputs a digital signal for the A/D converter output 108, to the computing circuit 109 and the holding circuit 116. The holding circuit 116 retains the inputted A/D converter output 108, and outputs a holding circuit output 127 to the selector 118. The computing circuit 109 receives the standard voltage 110 serving as the target value for the output voltage 104 and the A/D converter output 108, and outputs the difference voltage 111 serving as the deviation signal, to the power controller circuit 112. The power controller circuit 112 inputs the difference voltage 111 and the range information output 124 serving as the output signal from the range information 121 and outputs a data signal 113 serving as the signal according to the deviation signal, to the PWM generator circuit 114 and to the computing unit 117.

The range information output 124 is also simultaneously inputted to the selector 118. The data signal 113 is inputted to the PWM generator circuit 114 which outputs the PWM signal 115 to the switching transistor driver 105. The PWM signal inputted to the switching output transistor 105 is output to the switching transistor 102. The data signal 113 outputted from the power controller circuit 112 is also sent to another input which is the computing unit 117. The data signal 113 and the computing unit clock 126 outputted from the clock generator circuit 125 are inputted to the computing unit 117 and the computing unit 117 outputs a computing unit output 128 to the selector 118.

An output signal from the holding circuit 116 and an output signal from the computing unit 117 are inputted to the selector 118, and the selector 118 outputs a selector output 119 to the computing unit 120. The selector output 119 that is outputted from the selector 118 and the computing unit clock 126 that is outputted from the clock generator circuit 125 are inputted to the computing unit 120, and the computing unit 120 outputs a maximum voltage value 122 and a minimum voltage value 123 to the A/D converter 107, and also outputs a signal to the range information 121.

Figure 2:
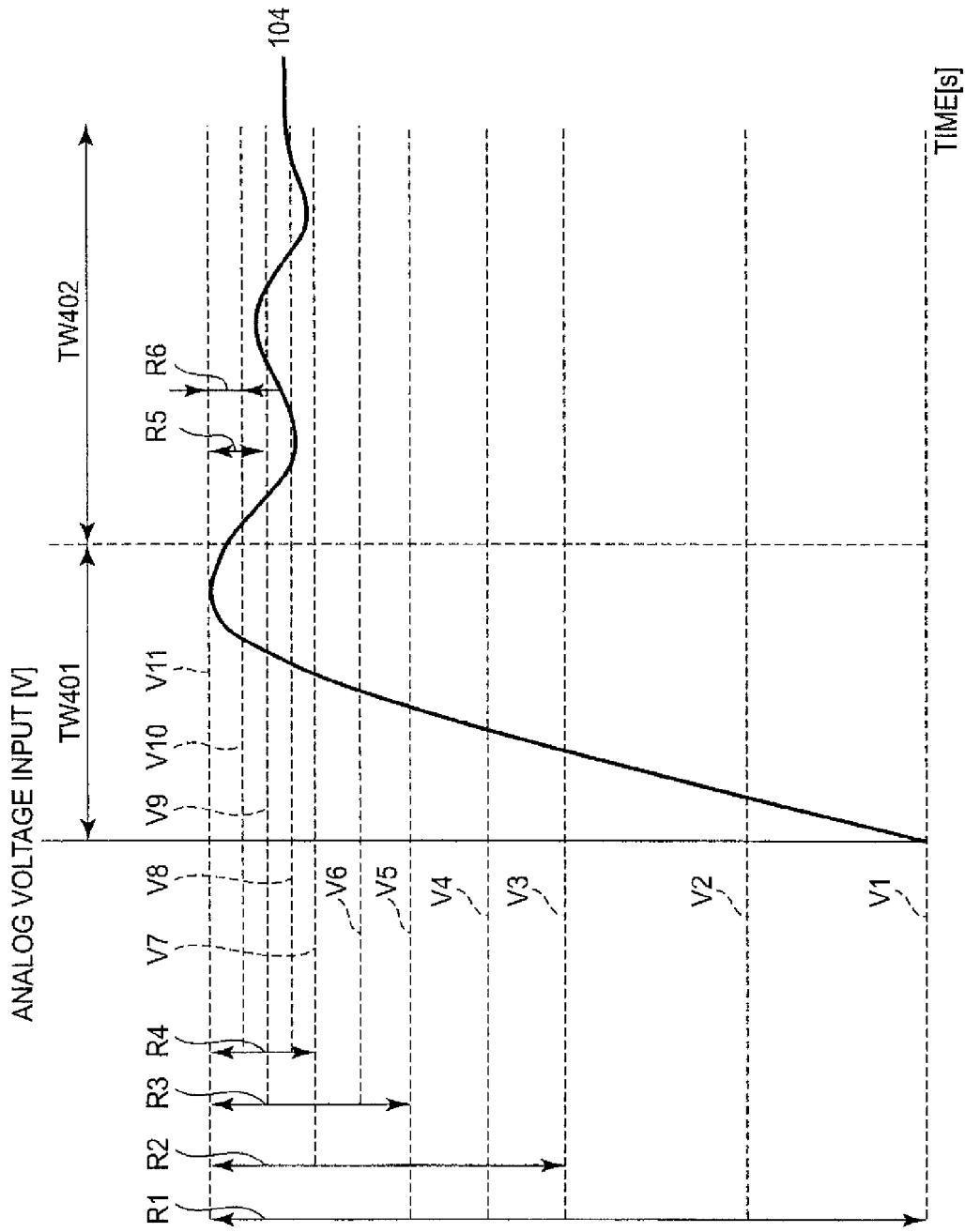
FIG. 2 is a chart showing the interrelation of conversion range with the applicable input signal in the A/D converter of the power supply controller of the present invention.

FIG. 2 is a chart showing the interrelation of conversion range and the applicable input signal in the A/D converter of the power supply controller of the first exemplary embodiment. In this description, the minimum value of the input range of the A/D converter 107 is referred to as Vmin, and the maximum value as Vmax. The power supply controller 100 switches among the four ranges of a first range R1, a second range R2, a third range R3, and a fourth range R4, in the startup period TW401. In the first range R1, an eleventh voltage value V11 is set in Vmax; and a first voltage value V1 is set in Vmin. In the second range R2, an eleventh voltage value V11 is set in Vmax; and a third voltage value V3 is set in Vmin. In the third range R3, an eleventh voltage value V11 is set in Vmax; and a fifth voltage value V5 is set in Vmin. In the fourth range R4, an eleventh voltage value V11 is set in Vmax; and a seventh voltage value V7 is set in Vmin.

In the steady state period TW402, the power supply controller 100 switches among the three ranges consisting of the fourth range R4, the fifth range R5, and the sixth range R6. In the fifth range R5, an eleventh voltage value V11 is set in Vmax; and a ninth voltage value V9 is set in Vmin. In the sixth range R6, an eleventh voltage value V11 is set in Vmax; and a tenth voltage value V10 is set in Vmin.

The operation of the power supply controller of the first exemplary embodiment is described next while referring to FIG. 1 and FIG. 2. In the startup period TW401 of output voltage 104, the conversion range setting unit 170 retains the A/D converter output 108 in the holding circuit 116, selects the holding circuit output 127 by way of the selector 118 and outputs it to the computing unit 120. Determining the Vmin for the next A/D conversion processing from the selector output 119 in computing unit 120 sets the reference voltage range for the next A/D conversion processing.

In the steady state period TW402 of output voltage 104, the conversion range setting unit 170 utilizes the data signal 113 in the computing unit 117 to calculate the increase/decrease width of output voltage 104 in the next A/D conversion process. The selector 118 selects the computing unit output 128 as the calculation results and outputs them to the computing unit 120. Determining the Vmin for the next A/D conversion processing from the selector output 119 in computing unit 120 sets the reference voltage range for the next A/D conversion processing.

The range information output 124 is utilized to switch the selector 118 in the startup period TW401 and the steady state period TW402. In the startup period TW401, the range information 121 shifts from the startup period TW401 to the steady state period TW402 by setting the conversion range setting to the fourth range R4, and the range information output 124 is switched by selector 118 so as to output the computing unit output 128 to the selector output 119.

The A/D converter 107 has a two bit quantization resolution function. The operation in which the A/D converter output 108 sets the offset in the startup period TW401 is described using conversion processing in a voltage range of 0 to 4 V as an example. In this description, XXb (X indicates 0 or 1) represents the binary notation.

In the initial A/D conversion process, conversion is performed in the first range R1 by two bit quantization resolution. In the first range R1, the first voltage value V1 is set in Vmin, and the eleventh voltage value V11 is set in Vmax. The first voltage value V1 is 0 V, the second voltage value V2 is 1 V, the third voltage value V3 is 2 V, the fifth voltage value V5 is 3 V, and the eleventh voltage value V11 is 4 V. The relation of the output voltage 108 to the A/D converter output 104 is therefore such that: the first voltage value V1–second voltage value V2 will be 00b, the second voltage value V2–third voltage value V3 will be 01b, the third voltage value V3–fifth voltage value V5 will be 10b, and the fifth voltage value V5–eleventh voltage value V11 will be 11b, and the resolution will be 1 V.

When the A/D converter output 108 was 10b or 11b during conversion in the first range R1, then in the next A/D conversion processing, two bit conversion will be performed on the second range R2 set with Vmin at third voltage value V3, and Vmax at the eleventh voltage value V11. When two bit conversion was performed in the first range R1, and the A/D converter output 108 was 00b or 01b, then the next A/D conversion processing will be performed in first range R1 the same as in the previous A/D conversion processing and set with Vmin at the first voltage value V1, and Vmax at the eleventh voltage value V11.

When conversion by two bit quantization resolution (hereafter, two bit quantizing) was performed in the first range R1, and the A/D converter output 108 was 10b or 11b, then in the next A/D conversion processing, two bit quantizing will be performed in the second range R2, and the third voltage value V3 will be 2 V, the fourth voltage value V4 will be 2.5 V, the fifth voltage value V5 will be 3 V, the seventh voltage value V7 will be 3.5 V, and the eleventh voltage value V11 will be 4 V. The relation of the output voltage 104 to the A/D converter output 108 will therefore be such that: the third voltage value V3–fourth voltage value V4 will be 00b, and the fourth voltage value V4–fifth voltage value V5 will be 01b, the fifth voltage value V5–seventh voltage value V7 will be 10b, and the seventh voltage value V7–eleventh voltage value V11 will be 11b, and the resolution will be 0.5 V.

When conversion by two bit quantizing was performed in the second range R2, and the A/D converter output 108 was 10b or 11b, then in the next A/D conversion processing, two bit quantizing will be performed in the third range R3, set with Vmin at the fifth voltage value V5, and Vmax at the eleventh voltage value V11. In the conversion performed in the second range R2, and the A/D converter output 108 was 00b or 01b, then the next A/D conversion processing will be performed in the second range R2 the same as in the previous A/D conversion processing and set with Vmin at the third voltage value V3, and Vmax at the eleventh voltage value V11.

When conversion by two bit quantizing was performed in the second range R2, and the A/D converter output 108 was 10b or 11b, then the fifth voltage value V5 will be 3 V, the sixth voltage value V6 will be 3.25 V, the seventh voltage value V7 will be 3.5 V, the ninth voltage value V9 will be 3.75 V, and the eleventh voltage value V11 will be 4 V. The relation of the output voltage 104 to the A/D converter output 108 will therefore be such that: the fifth voltage value V5–sixth voltage value V6 will be 00b, and the sixth voltage value V6–seventh voltage value V7 will be 01b, the seventh voltage value V7–ninth voltage value V9 will be 10b, and the ninth voltage value V9–eleventh voltage value V11 will be 11b, and the resolution will be 0.25 V.

When conversion by two bit quantizing was performed in the third range R3, and the A/D converter output 108 was 10b or 11b, then in the next A/D conversion processing, two bit quantizing will be performed in the fourth range R4, set with Vmin at the seventh voltage value V7, and Vmax at the eleventh voltage value V11. When conversion by two bit quantizing was performed in the third range R3, and the A/D converter output 108 was 00b or 01b, then the next A/D conversion processing will be performed in the third range R3 the same as in the previous A/D conversion processing and set with Vmin at the fifth voltage value V5 and Vmax at the eleventh voltage value V11.

When conversion by two bit quantizing was performed in the third range R3, and the A/D converter output 108 was 10b or 11b, the seventh voltage value V7 becomes 3.5 V, the eighth voltage value V8 becomes 3.625 V, the ninth voltage value V9 becomes 3.75 V, the tenth voltage value V10 becomes 3.875 V, and the eleventh voltage value V11 becomes 4 V. The relation of the output voltage 104 to the A/D converter output 108 will therefore be such that: the seventh voltage value V7–eighth voltage value V8 will be 00b, the eighth voltage value V8–ninth voltage value V9 becomes 01b, the ninth voltage value V9–tenth voltage value V10 becomes 10b, the tenth voltage value V10–eleventh voltage value V11 becomes 11b, and the resolution will be 0.125 V.

Figure 3:
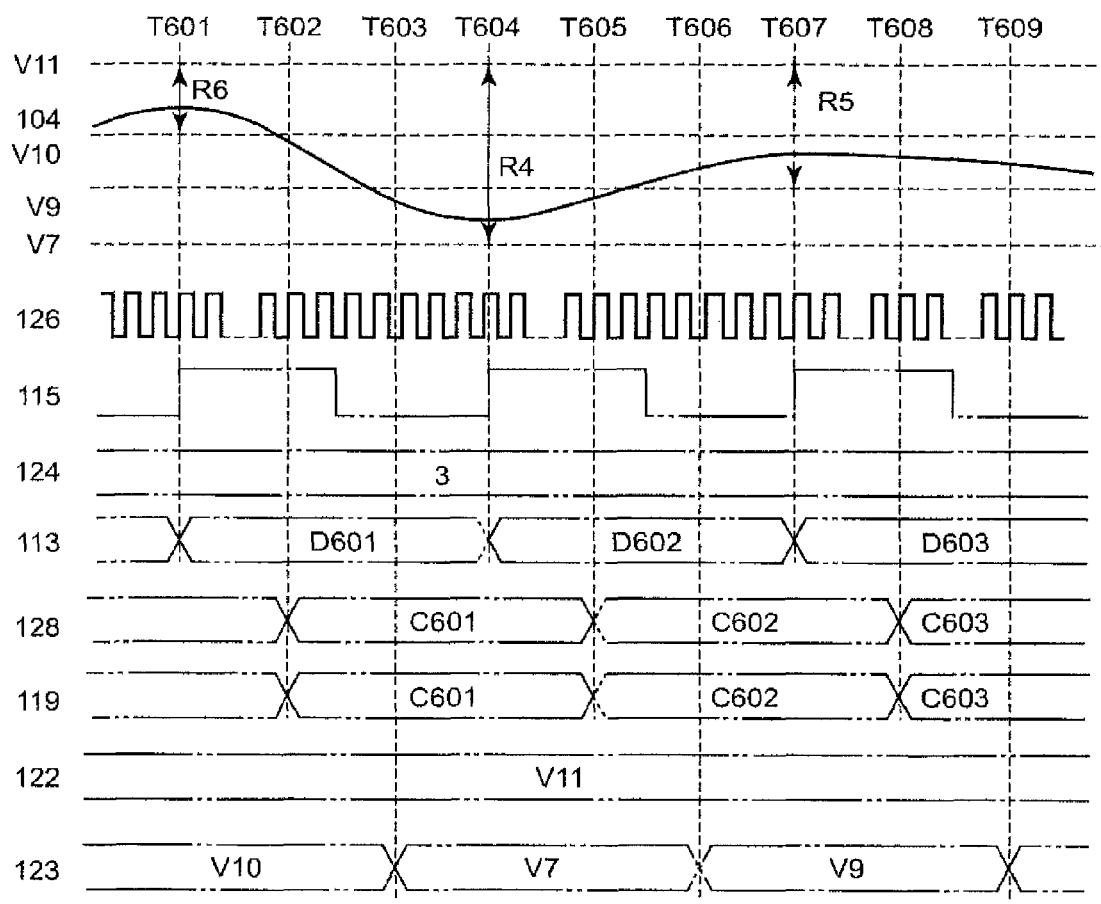
FIG. 3 is a timing chart for the conversion range setting operation performed by way of the PWM duty data in the A/D converter of the power supply controller of the present invention.

FIG. 3 is a timing chart for the conversion range setting operation by the PWM duty data in the present invention. Operation of the steady state TW402 that determines the conversion range of the A/D converter 107 based on the data signal 113 is described. At the sampling timing T601, the A/D converter 107 sets the tenth voltage value V10 to Vmin using the computing unit 120, and the output voltage 104 is sampled in the sixth range R6 with the eleventh voltage value V11 set to Vmax by the computing unit 120. The power controller circuit 112 outputs a data signal 113 for the output voltage sampled at the sampling timing T601 to the computing unit 117 as data D601.

The power controller 112 inputs the data signal 113 into the computing unit 117 at timing T602. The computing unit 117 calculates the range of output voltage 104 regulated by the PWM signal 115 based on this data signal 113, and outputs a computing unit (clock) output 128. The output voltage 104 range is changed based on duty of the PWM signal 115. The selector 118 utilizes the range information output 124 to output the setting range data C601 calculated in selector output 119, to the computing unit 120.

At timing T603, the computing unit 120 calculates the maximum voltage value 122 serving as Vmax and the minimum voltage value 123 serving as Vmin set in A/D converter 107 based on the setting range data C601. The Vmax is here clamped at 4 V serving as the eleventh voltage value V11 so the processing only calculates the Vmin, and the seventh voltage value V7 is output to the minimum voltage value 123.

At the next sampling timing T604, the A/D converter 107 samples the output voltage 104 in the fourth voltage range R4 where the seventh voltage value V7 is set to Vmin by way of the computing unit 120, and the eleventh voltage V11 is set to Vmax by way of the computing unit 120. The power controller circuit 112 outputs the data signal 113 for the output voltage 104 sampled at the sample timing T604, as the data D602 to the computing unit 117.

At the timing T605, the data signal 113 is inputted to the computing unit 117. The computing unit 117 calculates the range of the output voltage 104 regulated by the PWM signal 115, based on the data signal 113, and outputs it as a computing unit output 128. The range of the output voltage 104 is changed based on the duty of PWM signal 115. The selector 118 outputs the setting range data C602 calculated in selector output 119 to the computing unit 120.

At the timing T606, the computing unit 120 calculates the minimum voltage value 123 serving as Vmin, and the maximum voltage value 122 serving as Vmax for setting in the A/D converter 107, based on the setting range data C602. The Vmax is here clamped at 4 V serving as the eleventh voltage value V11 so the processing only calculates the Vmin, and the ninth voltage value V9 is output to the minimum voltage value 123.

In the next sampling timing T607, the A/D converter 107 samples the output voltage 104 in the fifth range R5 where the ninth voltage V9 is set to Vmin by way of the computing unit 120 and the eleventh voltage value V11 is set to Vmax by the computing unit 120. The power controller circuit 112 outputs the data signal 113 for the output voltage 104 sampled at the sampling timing T607, to the computing unit 117 as the data D603.

At the timing T608, the data signal 113 is inputted to the computing unit 117. The computing unit 117 calculates the range of the output voltage 104 controlled by the PWM signal 115 based on the data signal 113, and outputs it as the computing unit output 128. The range of output voltage 104 is changed based on the duty of the PWM signal 115. The selector 118 outputs the setting range data C603 calculated in selector output 119 to the computing unit 120.

At the timing T609, the computing unit 120 calculates the minimum voltage value 123 serving as Vmin and the maximum voltage value 122 serving as Vmax for setting in the A/D converter 107 based on the setting range data C603. The timing from T601 to T609 is repeated from here onwards.

Figure 4:
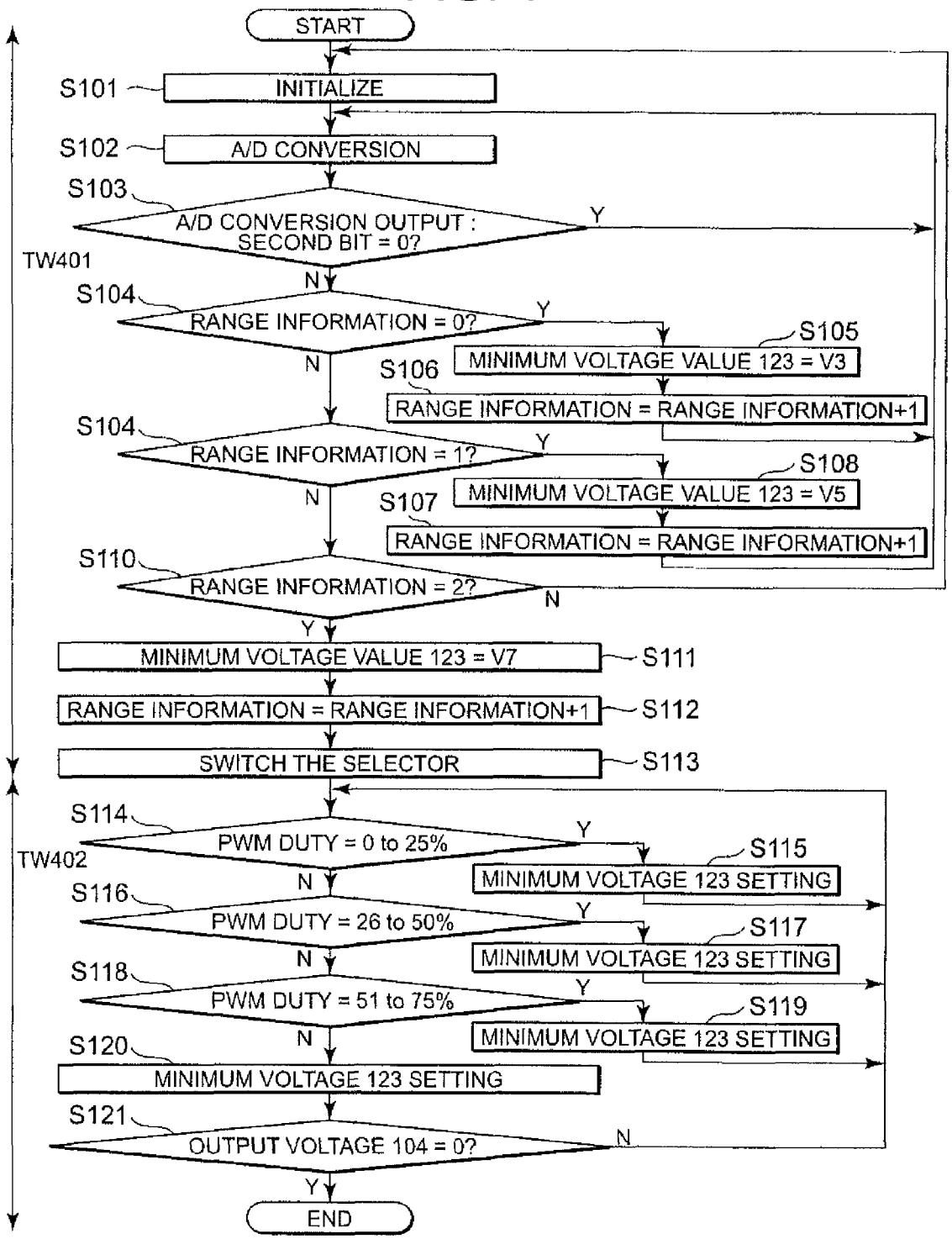
FIG. 4 is a flow chart showing the operation for controlling the offset in the A/D converter of the power supply controller of the present invention.

FIG. 4 is a flow chart of the offset control operation of the present invention. The operation for setting the offset based on the A/D converter output 108 in the initial startup period TW401 is described next.

The computing unit 120 first of all initializes the range information setting it to 0. The selector 118 input at this time, is switched to the output of holding circuit 116. The power controller circuit 112 starts control based on the 0 output of range information output 124, and responds to operation in the startup period. (S101). The A/D converter 107 performs A/D conversion processing (S102).

If the second bit of A/D converter output 108 is 1, then the process shifts to step S104, and if the second bit is 0 then the process shifts to step S102 (S103).

If the range information 121 is 0, then the process shifts to step S105, and if the range information 121 is other than 0 then the process shifts to step S107 (S104).

If the range information 121 is 0 then an addition is made to the first offset value, setting the third voltage value V3 in the minimum voltage value 123, and based on the range information output 124 being 0, the power controller circuit 112 starts executing control in response to setting the third voltage value V3 as the offset value (S105).

The range information 121 is incremented and the process shifts to step S102 (S106).

If the range information 121 is 1, then the process shifts to step S108, and if the range information 121 is other than 0 or 1 then the process shifts to step S110 (S107).

If the range information 121 is 1, then an addition is made to the second offset value, setting the fifth voltage value V5 in the minimum voltage value 123 and, based on the range information output 124 being 1, the power controller circuit 112 starts executing control in response to setting the fifth voltage value V5 as the offset value (S108).

The range information 121 is incremented and the process shifts to step S102 (S109).

If the range information 121 is 2, then the process shifts to step S111, and if the range information 121 is other than 2, then the process shifts to step S101 (S110).

If the range information 121 is 2, then an addition is made to the third offset value, setting the seventh voltage value V7 in the minimum voltage value 123, and based on the range information output 124 being 2, the power controller circuit 112 starts executing control in response to setting the seventh voltage value V7 as the offset value (S111).

The range information 121 is incremented and the process shifts to step S113 (S112).

The range information output 124 switched the selector 118 to the computing unit 117 output, and functions in response to operation in steady state period (S113).

The operation for setting the offset based on the data signal 113, in the steady state period TW402 from step S114 onward is described next.

If the data signal 113 exhibits a duty of 0 to 25 percent, then the process shifts to step S115, and if other than a duty of 0 to 25 percent then the process shifts to step S116 (S114). A value corresponding to a duty of 0 to 25 percent is set in the minimum voltage value 123 and the process shifts to step S114 (S115). If the data signal 113 exhibits a duty of 26 to 50 percent, then the process shifts to step S117, and if data signal 113 exhibits a duty other than 26 to 50 percent then the process shifts to step S118 (S116). A value corresponding to a duty of 26 to 50 percent is set in the minimum voltage value 123 and the process shifts to step S114 (S117).

If the data signal 113 exhibits a duty of 51 to 75 percent, then the process shifts to step S119, and if other than a duty of 51 to 75 percent then the process shifts to step S120 (S118). A 51 to 75 percent duty value is set in the minimum voltage value 123 and the process shifts to step S114 (S119). A value corresponding to a duty of 76 to 100 percent is set in the minimum voltage value 123 and the process shifts to step S121 (S120). If the output voltage 104 is 0, then the processing is terminated, and if other than 0 then the process shifts to step S114 (S121).

The steps S101-S112 correspond to the operation in the startup period TW401, and the steps S114-S121 correspond to the operation in the steady state period TW402. Step S113 is a step for switching the operation between the startup period TW401 and the steady state period TW402.

The power supply controller of the first exemplary embodiment as described above is therefore capable of a quick power supply voltage startup by setting the range of the reference voltage based respectively on the A/D converter output signal in the power supply startup period; and the deviation signal or a signal using the deviation signal in the steady state period. Moreover, normal A/D conversion process is achieved without deviating from the reference voltage range since the minimum voltage value is changed without changing the maximum voltage value.

Controlling the minimum voltage value acts to narrow the reference voltage range as the output voltage approaches the steady state period. Therefore even A/D converters with a quantizing function of a few bits can attain high-resolution A/D conversion in the steady state period. In other words a reference voltage range that maintains high resolution can be set.

Moreover, even A/D converters with a 2 bit quantizer function can attain a quantizing resolution of five bits in the steady state period so that a high resolution effect can be achieved at low current consumption.

Second Exemplary Embodiment

Figure 5:
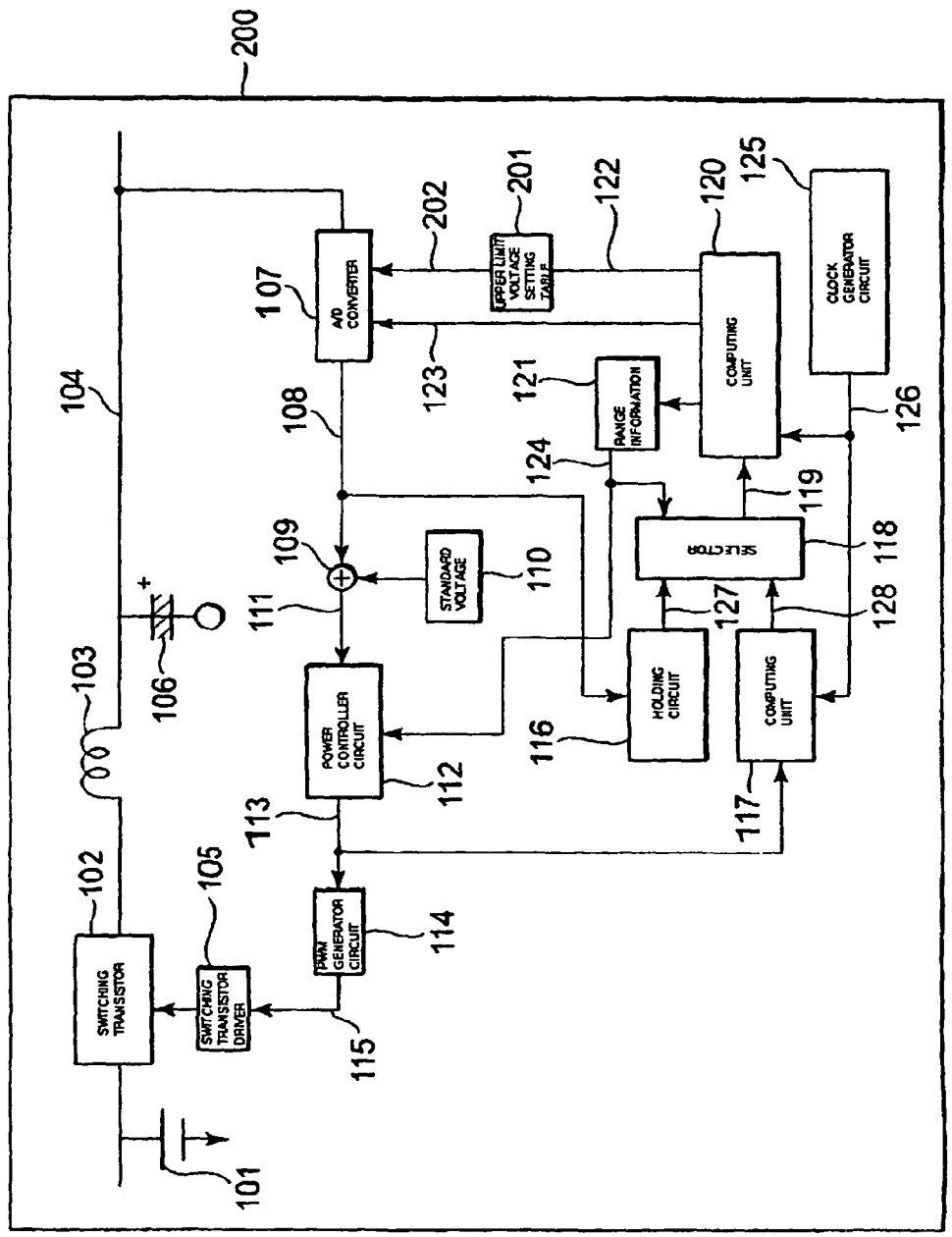
FIG. 5 is a block diagram of the power supply controller of a second exemplary embodiment of the present invention.

FIG. 5 is a block diagram of the power supply controller of a second exemplary embodiment. The power supply controller 200 shown in FIG. 5, is the power supply controller shown in FIG. 1 but further including an upper limit voltage setting table 201. Other sections of the structure are assigned the same reference numerals (as the first exemplary embodiment) so their description is omitted. In this structure, the maximum voltage value 122 outputted from the computing unit 120, is inputted to the upper voltage setting table 201, and the upper limit voltage value 202 and the minimum voltage value 123 are output to the A/D converter 107.

Figure 6:
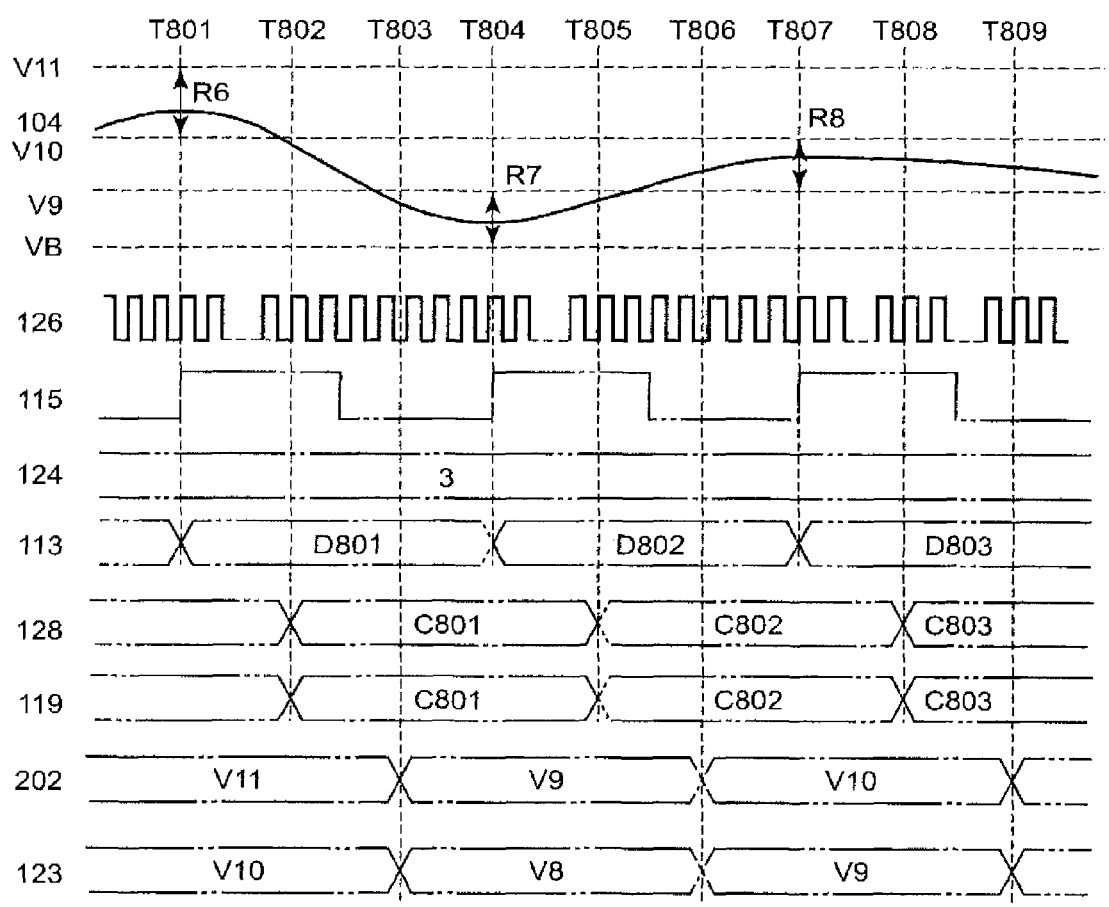
FIG. 6 is a timing chart of the conversion range setting operation by way of the PWM duty data in the A/D converter of the power supply controller of the second exemplary embodiment of the present invention.
Figure 7:
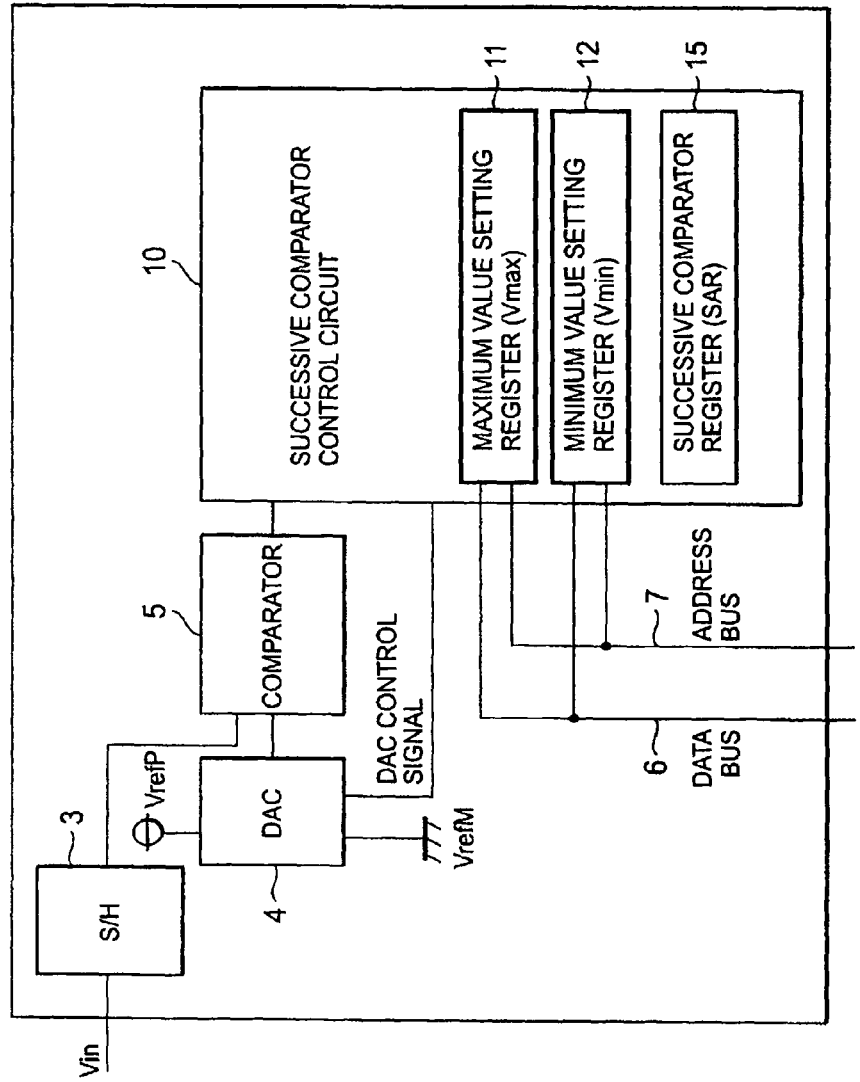
FIG. 7 is a block diagram of the A/D converter for a related art.
Figure 8:
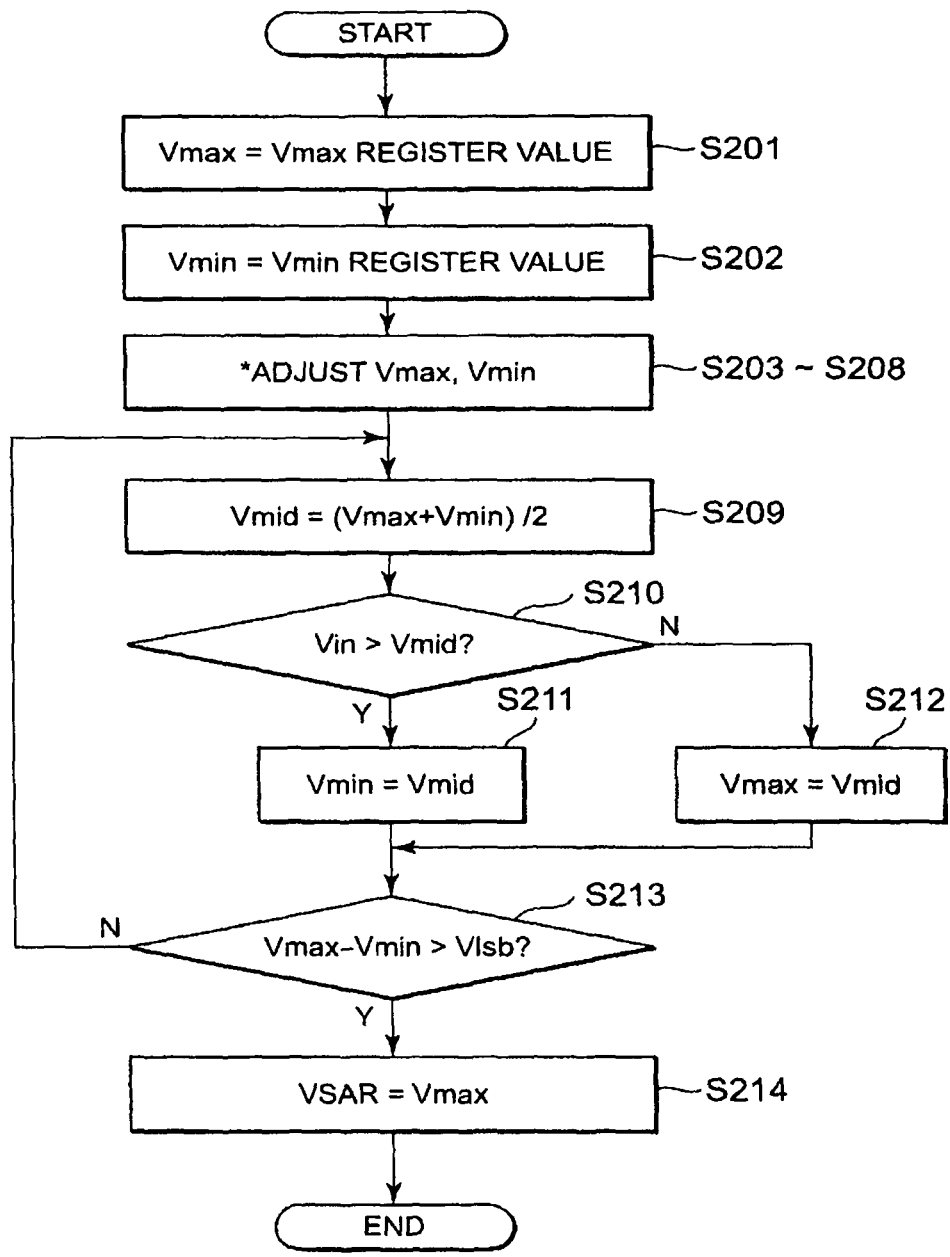
FIG. 8 is a flow chart for the successive comparison operation of the A/D converter of the related art.
Figure 9:
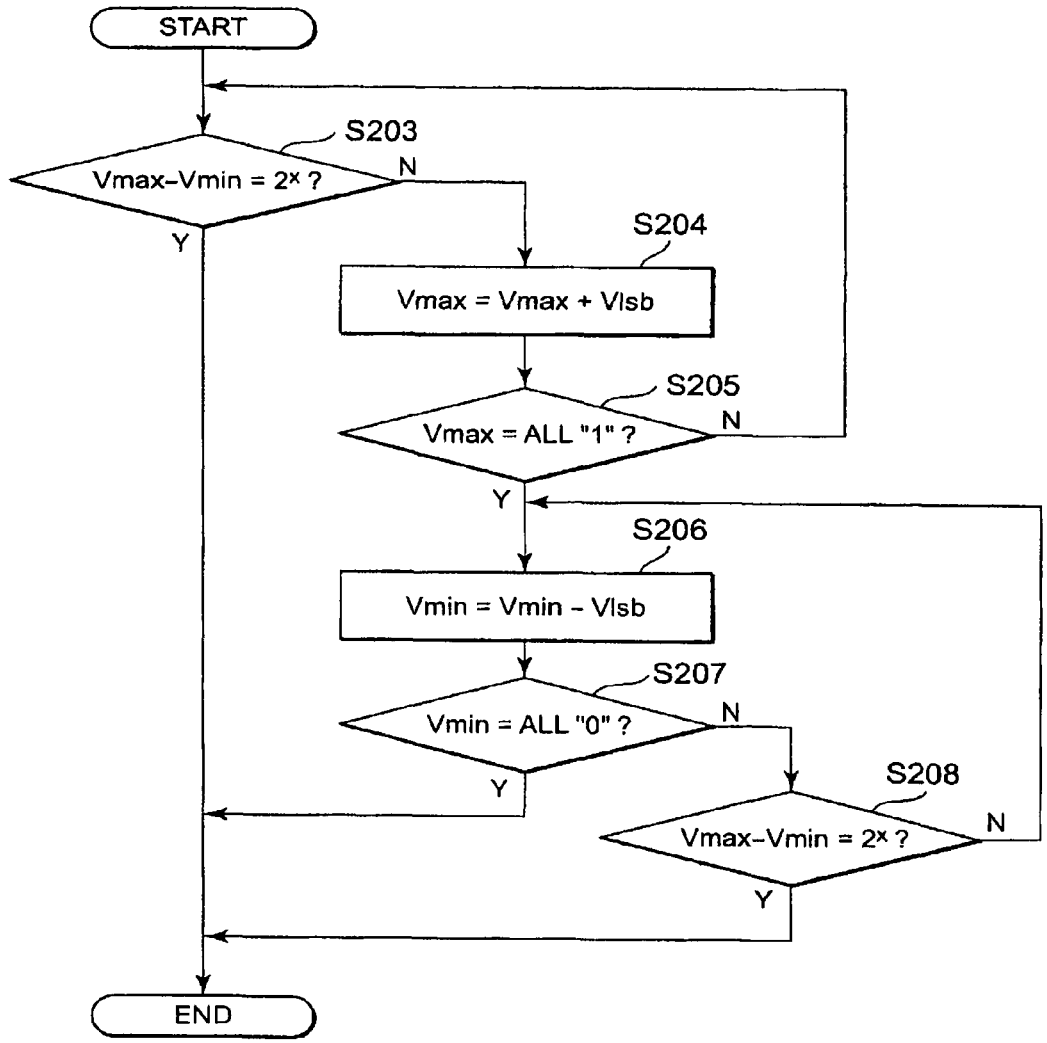
FIG. 9 is a flow chart showing the flow of setting of the range of the reference voltage outputted from the DAC in the A/D converter of the related art.

FIG. 6 is a timing chart of the operation for setting the conversion range in the first exemplary embodiment by using the PWM duty data in the A/D converter of the power supply controller of the present invention. The conversion range of A/D converter 107 is set based on the data signal 113. The steady state period TW402 operation in FIG. 2 is described.

At the sampling timing T801 in FIG. 6, the A/D converter 107 sets the tenth voltage value V10 in the Vmin by way of the computing unit 120, and samples the output voltage 104 in the sixth range R6 with the eleventh voltage value V11 set in the Vmax by the computing unit 120. The power controller circuit 112 outputs the data signal 113 corresponding to the output voltage 104 sampled at the sampling timing T801 as the data D801 to the computing unit 117.

At the timing T802, the data signal 113 is input into the computing unit 117. The computing unit 117 calculates the range of the output voltage 104 controlled by the PWM signal 115 based on the data signal 113, and outputs a computing unit (clock) output 128. The range of the output voltage 104 is changed based on duty of the PWM signal 115. The selector 118 utilizes the range information output 124 to output the setting range data C801 calculated in selector output 119, to the computing unit 120.

At the timing T803, based on the setting range data C801, the computing unit 120 calculates the minimum voltage value 123 serving as the Vmin and the maximum voltage value 122 serving as the Vmax for setting in the A/D converter 107. The upper limit voltage setting table 201 here outputs the ninth voltage value V9 to the upper limit voltage value 202 and the eighth voltage value V8 to the minimum voltage value 123.

At the next sampling timing T804, the A/D converter 107 sets the eighth voltage value V8 in Vmin by way of the computing unit 120, and samples the output voltage 104 in the seventh range R7 where the ninth voltage value V9 is set in Vmax by way of the upper limit voltage setting table 201. The power controller 112 outputs the data D802 serving as the data signal 113 for the output voltage 104 sampled at the sampling timing T804, to the computing unit 117.

At the timing T805, the data signal 113 is input into the computing unit 117. The computing unit 117 calculates the range of the output voltage 104 controlled by the PWM signal 115 based on the data signal 113, and outputs a computing unit (clock) output 128. The range of the output voltage 104 is changed based on duty of the PWM signal 115. The selector 118 utilizes the range information output 124 to output the setting range data C802 calculated in selector output 119, to the computing unit 120.

At the timing T806, based on the setting range data C802, the computing unit 120 calculates the minimum voltage value 123 serving as the Vmin and the maximum voltage value 122 serving as the Vmax for setting in the A/D converter 107. The upper limit voltage setting table 201 here outputs the tenth voltage value V10 into the upper limit voltage value 202, and outputs the ninth voltage value V9 into the minimum voltage value 123.

At the next sampling timing T807, the A/D converter 107 sets the ninth voltage value V9 in Vmin by way of the computing unit 120, and samples the output voltage 104 in the eighth range R8 where the tenth voltage value V10 is set in Vmax by the upper limit voltage setting table 201. The power controller 112 outputs the data D803 serving as the data signal 113 for the output voltage 104 sampled at the sampling timing T807 to the computing unit 117.

At the timing T808, the data signal 113 is input into the computing unit 117. The computing unit 117 calculates the range of the output voltage 104 controlled by the PWM signal 115 based on the data signal 113, and outputs a computing unit (clock) output 128. The selector 119 utilizes the range information output 124 to output the setting range data C803 calculated in the selector output 119, to the computing unit 120.

At the timing T809, based on the setting range data C803, the computing unit 120 calculates the minimum voltage value 123 serving as the Vmin, and the maximum voltage value 122 serving as the Vmax for setting in the A/D converter 107.

The operation from the sampling timing T801 to the timing T809 is repeated from here onwards.

The power supply controller of the second exemplary embodiment as described above is capable of controlling the minimum voltage value and the maximum voltage value in the steady state period and therefore performs no unnecessary conversion in the reference voltage range so that the A/D conversion speed can be accelerated.

In the above described first and second exemplary embodiments of the invention, the computing unit 120 inputs a data signal that was the output signal of power controller circuit 112. The present invention however is not limited to this example, and a difference voltage 111 may be inputted as the deviation signal.

Further, it is noted that Applicant's intent is to encompass equivalents of all claim elements, even if amended later during prosecution.

What is claimed is:

1. A power supply control method of performing a feedback control of an output voltage based on a deviation signal for a standard voltage value serving as a target value for the output voltage and a digital signal generated by analog/digital (A/D) conversion of the output voltage, the method comprising:
   selecting a range of the reference voltage for the A/D conversion based on the digital signal in a power supply startup period; and
   selecting a range of the reference voltage for the A/D conversion based on the deviation signal or a signal corresponding to the deviation signal in a steady state period.

2. The power supply control method according to claim 1, further comprising:
   setting the range of the reference voltage by changing a minimum voltage value of the reference voltage.

3. The power supply control method according to claim 1, further comprising:
   setting the range of the reference voltage by changing a maximum voltage value and a minimum voltage value of the reference voltage.

4. The power supply control method according to claim 1, wherein the range of the reference voltage includes a plurality of range levels, one of the range levels being selected based on a most significant bit of the digital signal during the power supply startup period.

5. The power supply control method according to claim 1, further comprising:
   generating a pulse width modulation (PWM) signal based on at least one of the digital signal, the deviation signal or the signal corresponding to the deviation signal,
   wherein the output voltage is controlled based on the PWM signal.

6. The power supply control method according to claim 5, wherein the range of the reference voltage includes a plurality of range levels, one of the range levels being selected based on a duty of the PWM signal during the steady state period.

7. The power supply control method according to claim 1, wherein the range of the reference voltage includes a plurality of range levels, a maximum voltage value of each of the range levels is equal to each other, and a minimum voltage value of each of the range levels is different to each other.

8. The power supply control method according to claim 7, wherein the plurality of range levels are set as a binary-coded range information.

* * * * *